United States Patent
Pellizzer et al.

(10) Patent No.: US 10,707,271 B2
(45) Date of Patent: *Jul. 7, 2020

(54) MEMORY CELLS HAVING RESISTORS AND FORMATION OF THE SAME

(71) Applicant: Micron Technology, Inc., Boise, ID (US)

(72) Inventors: Fabio Pellizzer, Boise, ID (US); Andrea Redaelli, Casatenovo (IT); Agostino Pirovano, Milan (IT); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/216,100

(22) Filed: Dec. 11, 2018

(65) Prior Publication Data

US 2019/0123105 A1 Apr. 25, 2019

Related U.S. Application Data

(62) Division of application No. 15/632,536, filed on Jun. 26, 2017, now Pat. No. 10,263,039.

(51) Int. Cl.
*H01L 27/24* (2006.01)
*H01L 45/00* (2006.01)
*H01L 49/02* (2006.01)

(52) U.S. Cl.
CPC ...... *H01L 27/2463* (2013.01); *H01L 27/2427* (2013.01); *H01L 28/20* (2013.01); *H01L 45/06* (2013.01); *H01L 45/12* (2013.01); *H01L 45/1233* (2013.01); *H01L 45/1253* (2013.01); *H01L 45/144* (2013.01);
(Continued)

(58) Field of Classification Search
CPC ............ H01L 27/2427; H01L 45/1233; H01L 45/1253; H01L 27/2463
See application file for complete search history.

(56) References Cited

U.S. PATENT DOCUMENTS 5,792,683 A * 8/1998 Hayashi ............... H01L 27/1112
438/238
8,422,269 B2 * 4/2013 Sasaki ................ G11C 13/0026
365/148

(Continued)

OTHER PUBLICATIONS

International Search Report and Written Opinion from related international application No. PCT/US2018/036985, dated Oct. 1, 2018, 16 pp.

*Primary Examiner* — Nicholas J Tobergte
(74) *Attorney, Agent, or Firm* — Brooks, Cameron & Huebsch, PLLC

(57) ABSTRACT

The present disclosure includes memory cells having resistors, and methods of forming the same. An example method includes forming a first conductive line, forming a second conductive line, and forming a memory element between the first conductive line and the second conductive line. Forming the memory element can include forming one or more memory materials, and forming a resistor in series with the one or more memory materials. The resistor can be configured to reduce a capacitive discharge through the memory element during a state transition of the memory element.

19 Claims, 14 Drawing Sheets

(52) U.S. Cl.
CPC ...... *H01L 45/1608* (2013.01); *H01L 45/1675* (2013.01); *H01L 45/143* (2013.01)

(56) References Cited

U.S. PATENT DOCUMENTS

| | | | |
|---|---|---|---|
| 8,477,524 B2 * | 7/2013 | Kawamura | G11C 11/5678 |
| | | | 257/2 |
| 8,488,366 B2 * | 7/2013 | Kurosawa | G11C 13/0004 |
| | | | 365/148 |
| 8,507,353 B2 | 8/2013 | Oh et al. | |
| 8,605,525 B2 * | 12/2013 | Huang | G11C 29/50016 |
| | | | 365/185.22 |
| 8,729,523 B2 | 5/2014 | Pio | |
| 8,803,118 B2 | 8/2014 | Redaelli et al. | |
| 8,837,201 B2 * | 9/2014 | Bedeschi | G11C 13/0002 |
| | | | 365/148 |
| 8,841,649 B2 | 9/2014 | Pio | |
| 8,847,186 B2 | 9/2014 | Redaelli et al. | |
| 9,166,158 B2 | 10/2015 | Lengade et al. | |
| 9,978,810 B2 | 5/2018 | Pellizzer | |
| 10,134,470 B2 | 11/2018 | Tortorelli et al. | |
| 10,263,039 B2 * | 4/2019 | Pellizzer | H01L 45/06 |
| 2008/0062741 A1 * | 3/2008 | Choi | G11C 13/0004 |
| | | | 365/148 |
| 2010/0308296 A1 | 12/2010 | Pirovano et al. | |
| 2013/0094278 A1 | 4/2013 | Hou et al. | |
| 2013/0122680 A1 | 5/2013 | Jo | |
| 2013/0148404 A1 * | 6/2013 | Bandyopadhyay | G11C 11/5692 |
| | | | 365/103 |
| 2013/0187114 A1 | 7/2013 | Kai et al. | |
| 2014/0217349 A1 | 8/2014 | Hopkins | |
| 2015/0340610 A1 | 11/2015 | Jung et al. | |
| 2016/0027845 A1 | 1/2016 | Seong et al. | |

* cited by examiner

MEMORY CELLS HAVING RESISTORS AND FORMATION OF THE SAME

PRIORITY INFORMATION

This Application is a Divisional of U.S. application Ser. No. 15/632,536, filed Jun. 26, 2017, the contents of which are incorporated herein by reference.

TECHNICAL FIELD

The present disclosure relates generally to semiconductor memory cells and methods, and, more particularly, to memory cells having resistors and formation of the same.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistive memory cells that can store data based on the resistance state of a storage element (e.g., a resistive memory element having a variable resistance). As such, resistive memory cells can be programmed to store data corresponding to a target data state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration. A state of a resistive memory cell can be determined by sensing current through the cell responsive to an applied interrogation voltage. The sensed current, which varies based on the resistance level of the cell, can indicate the state of the cell.

DETAILED DESCRIPTION

Figure 1:
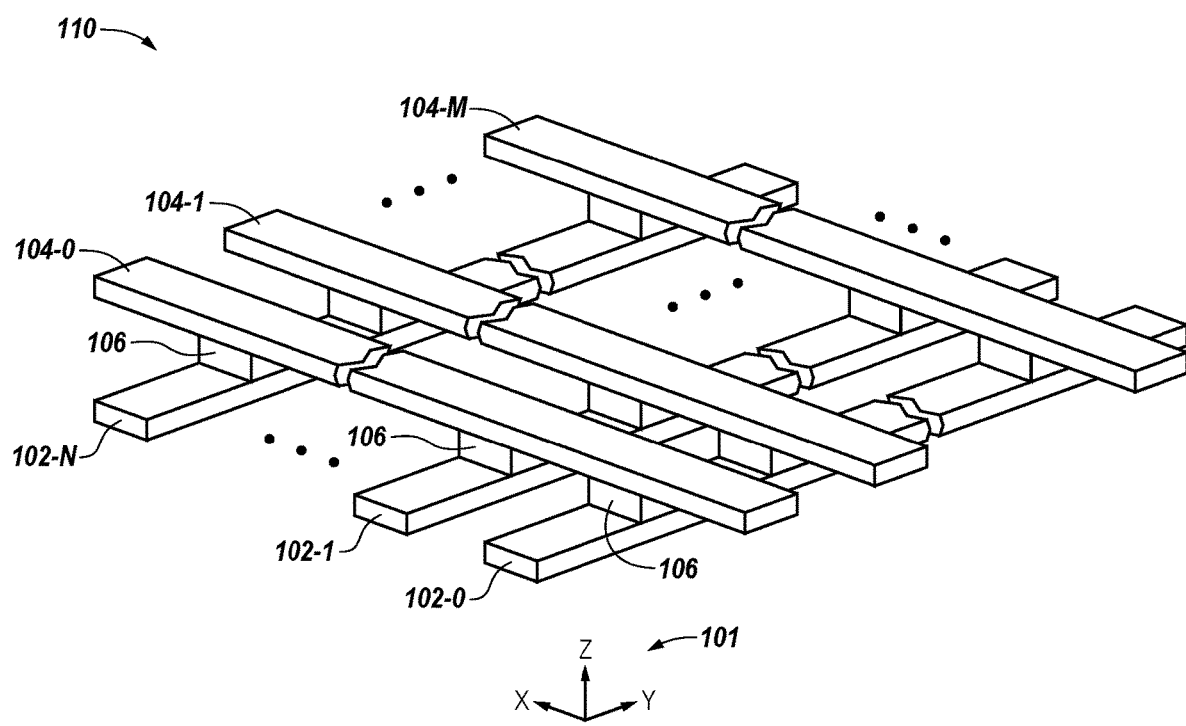
FIG. 1 is a block diagram of a portion of an array of memory cells having resistors in accordance with a number of embodiments of the present disclosure.

The present disclosure includes memory cells having resistors, and methods of forming the same. An example method includes forming a first conductive line, forming a second conductive line, and forming a memory element between the first conductive line and the second conductive line. Forming the memory element can include forming one or more memory materials, and forming a resistor in series with the one or more memory materials. The resistor can be configured to reduce a capacitive discharge through the memory element during a state transition of the memory element.

Embodiments of the present disclosure can provide benefits such as reducing cell damage that may be caused by current spikes through memory cells during operation as compared to previous approaches. For example, in various previous approaches, an "off" (e.g., high impedance state) to "on" (e.g., low impedance state) transition of a switch element of a memory element results in excessive capacitive discharge through the element (e.g., from bit line to word line or vice versa), which can undesirably stress the memory element and potentially reduce the reliability and/or useful life of the cell (e.g., by physically damaging the cell materials, which may change the electrical properties).

A number of embodiments can include forming one or more resistors in series with a memory element, which can serve to reduce current spikes resulting from capacitive discharge through memory cells during such off/on transitions, for example. A number of embodiments can also provide improved efficiency and/or reduced processing steps associated with forming memory cells as compared to prior approaches.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N" and "M", particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory banks) can refer to one or more memory banks, whereas a "plurality of" is intended to refer to more than one of such things. Furthermore, the words "can" and "may" are used throughout this application in a permissive sense (e.g., having the potential to, being able to), not in a mandatory sense (e.g., must).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 410 in FIG. 4.

FIG. 1 is a block diagram of a portion of an array 110 of memory cells in accordance with a number of embodiments of the present disclosure. In this example the array 110 is a cross-point array 110 including memory cells 106 between (e.g., at the intersections of) a first plurality of conductive lines 102-0, 102-1, . . . 102-N (e.g., access lines), which may be referred to herein as word lines, and a second plurality of conductive lines 104-0, 104-1, . . . 104-M (e.g., data lines), which may be referred to herein as bit lines. The conductive lines 102-0, 102-1, . . . 102-N and 104-0, 104-1, . . . 104-M can be collectively referred to as conductive lines 102 and 104, respectively. Coordinate axes 101 indicate that the conductive lines 104 are oriented in an x-direction and the conductive lines 102 are oriented in a y-direction, in this example. As illustrated, the conductive lines 102 are substantially parallel to each other and are substantially orthogonal to the conductive lines 104, which are substantially parallel to each other; however, embodiments are not so limited. As used herein, the term "substantially" intends that the modified characteristic need not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

The memory cells 106 arranged in a cross-point architecture can be memory cells such as those formed in accordance with the example illustrated in association with FIGS. 2A-2G and FIG. 3A-3I. As an example, the memory cells 106 can be phase change random access memory (PCRAM) cells, resistive random access memory (RRAM) cells, conductive random access memory (CBRAM) cells, and/or spin transfer torque random access memory (STT-RAM) cells, and/or 3D cross point memory cells, among other types of memory cells.

In various embodiments, the memory cells 106 can have a "stack" structure including a memory element, which can comprise one or more memory materials. In an embodiment, the memory element can comprise a memory material (e.g., a chalcogenide) that can serve as both a storage element and a switch element, and which may be referred to herein as a switch and storage material (SSM). In another embodiment, the memory element can comprise more than one memory material. For example, the memory element can comprise one memory material that is a switch element and another memory material that is a storage element (e.g., a switch element coupled in series with a storage element). The switch element can be a diode, field effect transistor (FET), a bipolar junction transistor (BJT), an ovonic memory switch (OMS), or an ovonic threshold switch (OTS), among others. In a number of embodiments, one or more memory materials may comprise a chalcogenide alloy; however, embodiments are not so limited.

In a number of embodiments, the switch element and storage element associated with the respective memory cells 106 can be series coupled two-terminal devices. For instance, the switch element can be a two-terminal OTS (e.g., a chalcogenide alloy formed between a pair of electrodes), and the storage element can be a two-terminal phase change storage element (e.g., a phase change material (PCM) formed between a pair of electrodes). A memory cell 106 including an OTS in series with a PCM can be referred to as a phase change material and switch (PCMS) memory cell. In a number of embodiments, an electrode can be shared between the switch element and storage element of the memory cells 106. Also, in a number of embodiments, the conductive lines 104 and the conductive lines 102 can serve as top or bottom electrodes corresponding to the memory cells 106.

As used herein, a storage element refers to a programmable portion of a memory cell 106 (e.g., the portion programmable to different resistance levels corresponding to respective data states). For example, in PCRAM and RRAM cells, a storage element can include the portion of the memory cell having a resistance that is programmable to data states responsive to applied programming signals (e.g., voltage and/or current pulses), for instance. A storage element can include, for instance, a resistance variable material such as a phase change material. As an example, the phase change material can be a chalcogenide alloy such as an indium (In)-antimony (Sb)-tellurium (Te) (IST) material (e.g., $In_2Sb_2Te_5$, $In_1Sb_2Te_4$, $In_1Sb_4Te_7$, etc.) or a germanium (Ge)-antimony (Sb)-tellurium (Te) (GST) material (e.g., $Ge_8Sb_5Te_8$, $Ge_2Sb_2Te_5$, $Ge_1Sb_2Te_4$, $Ge_4Sb_4Te_7$, $Ge_4Sb_4Te_7$, etc.), among other phase change materials. The hyphenated chemical composition notation, as used herein, indicates the elements included in a mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials include transition metal oxide materials or alloys including two or more metals (e.g., transition metals, alkaline earth metals, and/or rare earth metals). Embodiments are not limited to a particular resistive variable material or materials associated with the storage elements of the memory cells 106. For instance, other examples of resistive variable materials that can be used to form storage elements include binary metal oxide materials, colossal magnetoresistive materials, and/or various polymer based resistance variable materials, among others.

Although not illustrated, in a number of embodiments, the array 110 can be part of a three dimensional (3D) cross point memory array, with a plurality of arrays 110 vertically stacked on each other. In such embodiments, conductive lines such as 104 can serve as a bit line for one level of the 3D cross point memory array and as a word line for a subsequent level of the 3D cross point memory array, for instance.

In operation, the memory cells 106 of array 110 can be programmed by applying a voltage (e.g., a write voltage) across the memory cells 106 via selected conductive lines (e.g., word lines 102 and bit lines 104). The duration and/or magnitude of the voltage pulses across the memory cells 106 can be adjusted (e.g., varied) in order to program the memory cells 106 to desired data states (e.g., by adjusting a resistance level of the storage element).

A sensing (e.g., read) operation can be used to determine the data state of a memory cell 106. For instance, voltages can be applied to a bit line 104 and word line 102 corresponding to a selected memory cell 106, and current through the cell responsive to a resulting voltage difference can be sensed. Sensing operations can also include biasing unselected word lines and bit lines (e.g., word lines and bit lines coupled to non-selected cells) at particular voltages in order to sense the data state of a selected cell 106. For example, a half-select method, in which unselected word lines and bit lines are biased at half the voltage of the selected word line and bit line, can be used when reading a selected cell 106.

Programming and/or reading a memory cell 106 can involve a switching of the select element from relatively non-conducting high impedance "off" state to a conducting low impedance "on" state. Transition from the off to on state results in equalization between the bit line capacitance and word line capacitance, which can result in a current spike through the cell, the magnitude of which depends on the internal resistance of the cell. As described further herein, a number of embodiments of the present disclosure include forming at least one resistor in series with the cell memory element, which can reduce the magnitude of the current spike through the cell during operation (e.g., due to the "off" to "on" transition of the cell switch element).

For instance, in a number of embodiments, the memory cells 106 comprise a first resistor formed between the memory cells 106 and each respective one of the plurality of conductive lines 102, and/or a second resistor formed between the memory cells 106 and each respective one of the plurality of conductive lines 104.

FIGS. 2A-2G illustrate cross-sectional views of an example of processing steps associated with forming a portion of an array of memory cells in accordance with a number of embodiments of the present disclosure. As indicated, the left side of FIGS. 2A-2G represents a cross-sectional view along a y-direction (e.g., a word line direction), and the right side of FIGS. 2A-2G represents a cross-sectional view along an x-direction (e.g., a bit line direction). However, embodiments are not so limited. For instance, the x-direction can be a word line direction and the y-direction can be a bit line direction.

Figure 2A:
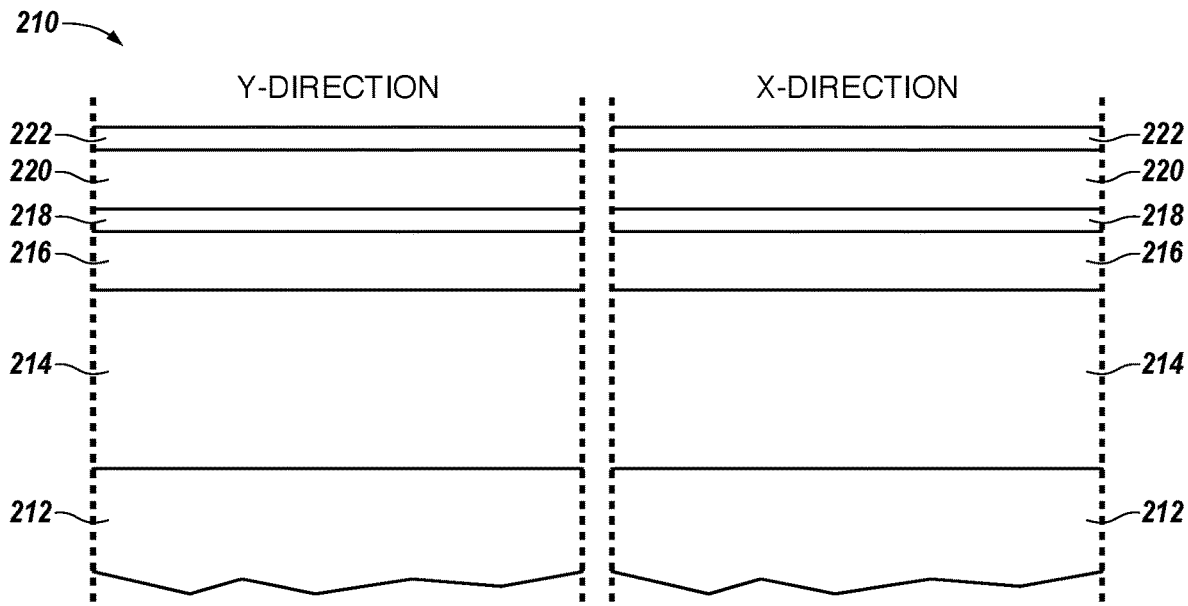
FIGS. 2A-2G illustrate cross-sectional views of an example of processing steps associated with forming a portion of an array of memory cells in accordance with a number of embodiments of the present disclosure.

FIG. 2A illustrates an array structure 210 comprising a material stack formed on a substrate 212. As used herein, the term "substrate" can include silicon-on-insulator (SOI) or silicon-on-sapphire (SOS) technology, doped and undoped semiconductors, epitaxial layers of silicon supported by a base semiconductor foundation, complementary metal oxide semiconductors (CMOS), and/or other semiconductor structures and technologies. Various circuitry, such as decode circuitry, for instance, associated with operating a memory array can be formed in substrate 212. Furthermore, when reference is made to a "substrate" in the following description, previous process steps may have been utilized to form regions or junctions in the base semiconductor structure or foundation.

In FIG. 2A, the stack of materials includes a conductive material 214 formed on the substrate 212, for instance, on a surface of the substrate 212. The conductive material can comprise, for instance, conductive and/or semi-conductive metals and metal alloys such as tungsten, titanium, platinum, nickel, strontium, hafnium, zirconium, tantalum, aluminum, oxides and nitrides thereof, and combinations thereof. However, embodiments are not limited to particular conductive and/or semi-conductive metals and metal alloys. In a number of embodiments, the conductive material 214 can be processed to serve as a plurality of conductive lines of the array. Although not shown in FIG. 2A, a number of additional materials (e.g., dielectric materials) can be formed between the conductive material 214 and substrate 212.

The array structure 210 shown in FIG. 2A includes a first resistor material 216 formed on the conductive material 214, a first electrode material 218 formed on the first resistor material 216, a memory material 220 formed on the first electrode material 218, and a second electrode material 222 formed on the memory material 220. The first and second electrode materials 218 and 222 can comprise various conductive and/or semiconductive materials and/or combinations thereof. In a number of embodiments, the first and second electrode materials 218 and 222 can comprise a carbon material having various structural configurations, such as amorphous carbon, graphite, diamond, and fullerenes (e.g., buckyballs), carbon nanotubes, carbon nanobuds, and carbon nanofibers, among others. Embodiments are not limited to a particular material compositions for first and second electrode materials 218 and 222. For example, the particular electrode materials 218 and 222 can be selected based on the type of memory material 220 and/or conductive line material 214 used, and/or based on the types of etchants used in processing, among other factors.

The memory material 220 can be a chalcogenide material such as a chalcogenide alloy and/or glass that can serve as a storage element and a switch element. For example, the memory material 220 can exhibit both select device (e.g., switching) properties and memory (e.g., storage) properties responsive to an applied voltage. As an example, for an applied voltage that is less than a threshold voltage ($V_{TH}$) of the cell, memory material 220 may remain in an "off" state (e.g., an electrically nonconductive state). Alternatively, responsive to an applied voltage that is greater than the threshold voltage, memory material 220 may switch to an "on" state (e.g., an electrically conductive state).

However, embodiments are not limited to the example shown in FIG. 2A. For instance, a memory material 220 may comprise two different materials with one serving as a storage element material and the other serving as a switch element material (e.g., with an additional electrode material therebetween). As an example, the memory material 220 may comprise a switch element material (e.g., chalcogenide alloy of an OTS), which can serve as the switch element of the memory cell, and a storage element material (e.g., a resistance variable material such as a chalcogenide or metal oxide material), which can serve as storage element of the memory cell.

The materials illustrated in FIG. 2A and in subsequent FIGS. 2B-2G can be formed via various semiconductor processes including, but not limited to, physical vapor deposition (PVD), chemical vapor deposition (CVD), and/or atomic layer deposition (ALD) processes. Such processing may incorporate various masking and etching techniques as well as planarization processes (e.g., chemical mechanical planarization (CMP)).

Figure 2B:
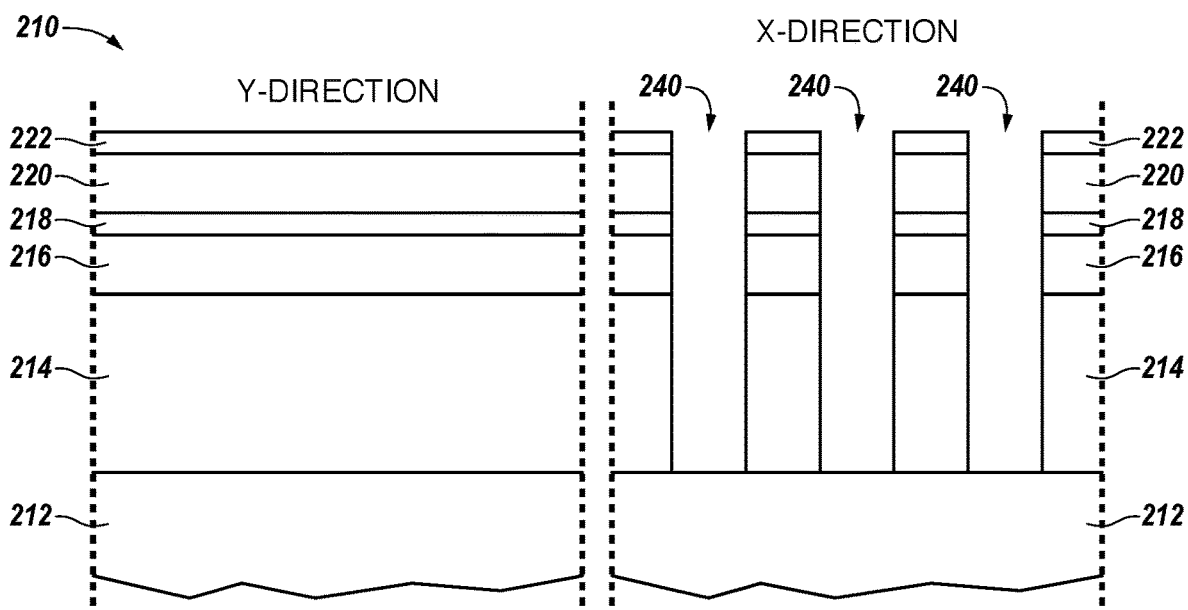

FIG. 2B illustrates the array structure 210 shown in FIG. 2A subsequent to performing an etch resulting in openings (e.g., trenches) 240. Although three openings 240 are illustrated, embodiments are not limited to a particular quantity. In this example, the etch is performed along the y-direction through the second electrode material 222, memory material 220, first electrode material 218, first resistor material 216, and first conductive material 214. Performing the etch shown in FIG. 2B results in definition of conductive lines 214 and the first resistor 216 extending in the direction of the etch.

Figure 2C:
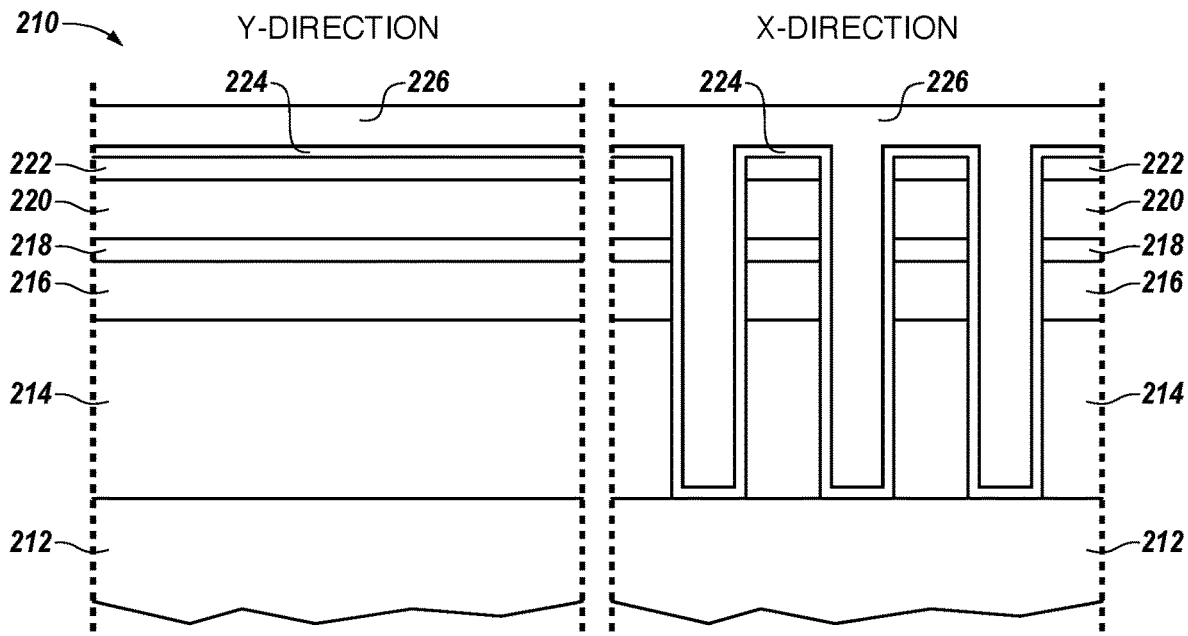
Figure 2D:
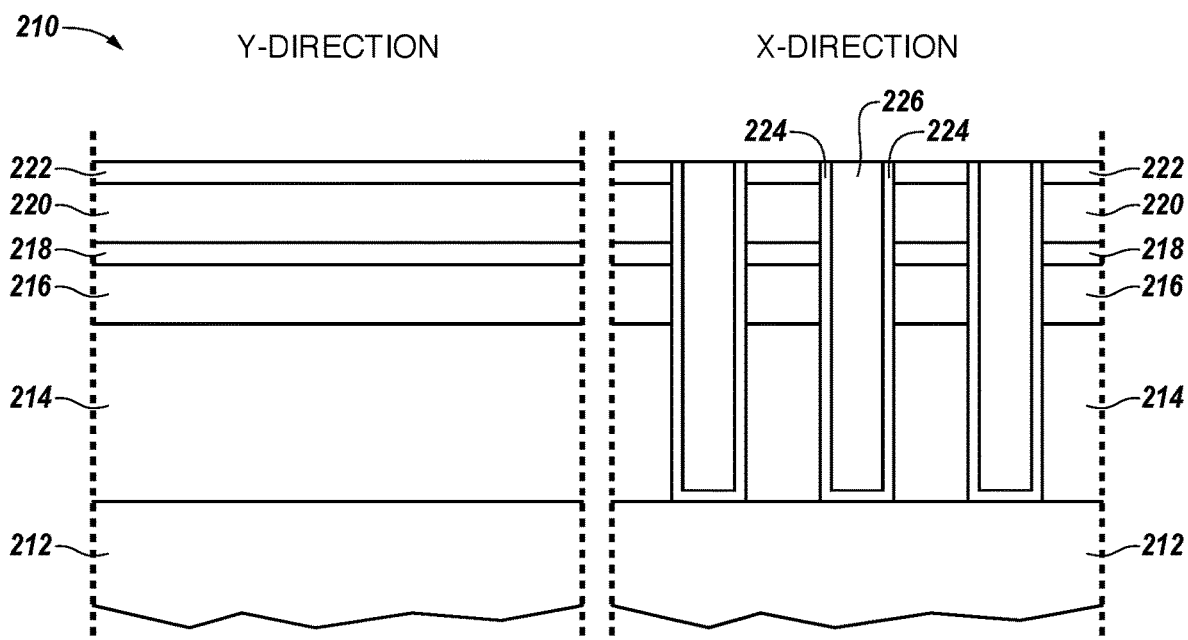
Figure 2E:
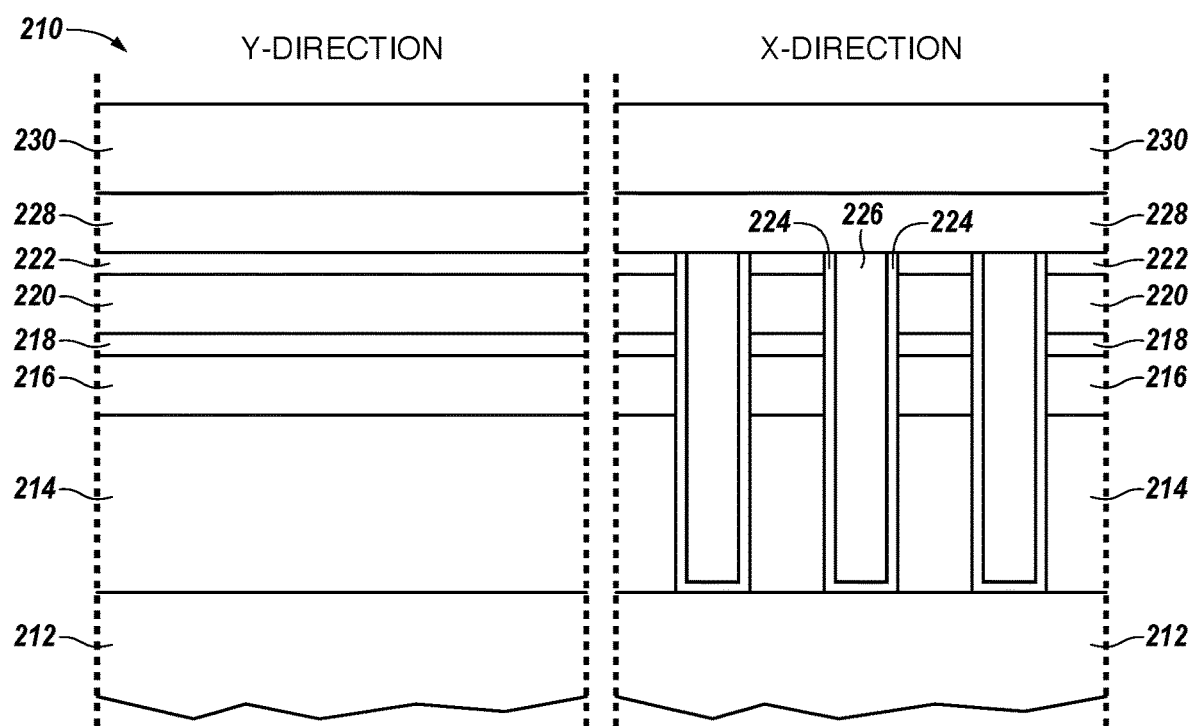

In the example shown in FIG. 2B, the stack does not comprise a second resistor material (e.g., a second resistor material 228 as illustrated in FIG. 2E). However, in a number of embodiments, a second resistor material can be formed (e.g., deposited) on, for instance, the second electrode material 222 prior to etching through the stack (e.g., such that the second resistor material is etched along with the other materials of the stack shown in FIG. 2B). As described further below, etching a second resistor material along with the stack shown in FIG. 2B can result in cells comprising an isolated second resistor (e.g., a resistor comprised of material 228 that is not continuous across multiple memory cells in either the x-direction or y-direction).

As an example, the openings 240 can be formed via a single patterned mask etch process. However, embodiments are not so limited. For instance, a liner material (e.g., a dielectric) can be formed on the stack after the memory material is etched but prior to etching of the resistor material 216 and/or conductive material 214, which may provide benefits such as protecting the memory material 220 from an etchant used to etch through the resistor material 216 and/or conductive material 214 (e.g., to prevent cross-contamination of materials).

FIG. 2C illustrates the array structure 210 shown in FIG. 2B subsequent to formation of sealing and filling materials 224 and 226, respectively, in the openings 240. As an example, the sealing material 224 can be formed on the stack shown in FIG. 2B. The sealing material 224 can be formed via a process such as an ALD process or a conformal CVD process, for instance. The filling material 226 can be formed on the stack and can serve to isolate memory cells, for instance.

The sealing and filling materials 224 and 226 can be, for example, a dielectric material, such as aluminum oxide ($Al_xO_Y$), silicon nitride ($Si_3N_4$), silicon dioxide ($SiO_2$), titanium dioxide ($TiO_2$), lanthanum oxide ($La_2O_3$), lanthanum aluminate ($LaAlO_3$), gallium oxide ($Ga_2O_3$), zirconium oxide ($ZrO_2$), zirconium silicon oxide ($Zr_xSi_yO_Z$), zirconium titanium oxide ($Zr_xTi_yO_Z$), hafnium oxide ($HfO_2$), hafnium titanium oxide ($Hf_xTi_yO_Z$), strontium titanate (SrTiO_3), lanthanum calcium manganese oxide (LCMO), magnesium oxide (MgO), tin dioxide ($SnO_2$), zinc peroxide ($ZnO_2$), titanium silicon oxide ($Ti_xSi_yO_Z$), and/or a hafnium silicon oxide ($Hf_xSi_yO_Z$), among other suitable dielectric materials.

FIG. 2D illustrates the array structure 210 shown in FIG. 2C subsequent to performing a planarization process (e.g., CMP). As an example, the planarization process can be performed to expose an upper surface of the electrode material 222 (e.g., by removing portions of sealing material 224 and filling material 226.

FIG. 2E illustrates the array structure 210 shown in FIG. 2D subsequent to forming a second resistor material 228 and a second conductive material 230 thereon. In a number of embodiments, the conductive material 230 can serve as conductive lines (e.g., bit lines) of the array. The conductive material can comprise tungsten, titanium, platinum, nickel, strontium, hafnium, zirconium, tantalum, aluminum, oxides and nitrides thereof, and/or combinations thereof, among various other suitable conductive and/or semi-conductive metals and metal alloys.

Figure 2F:
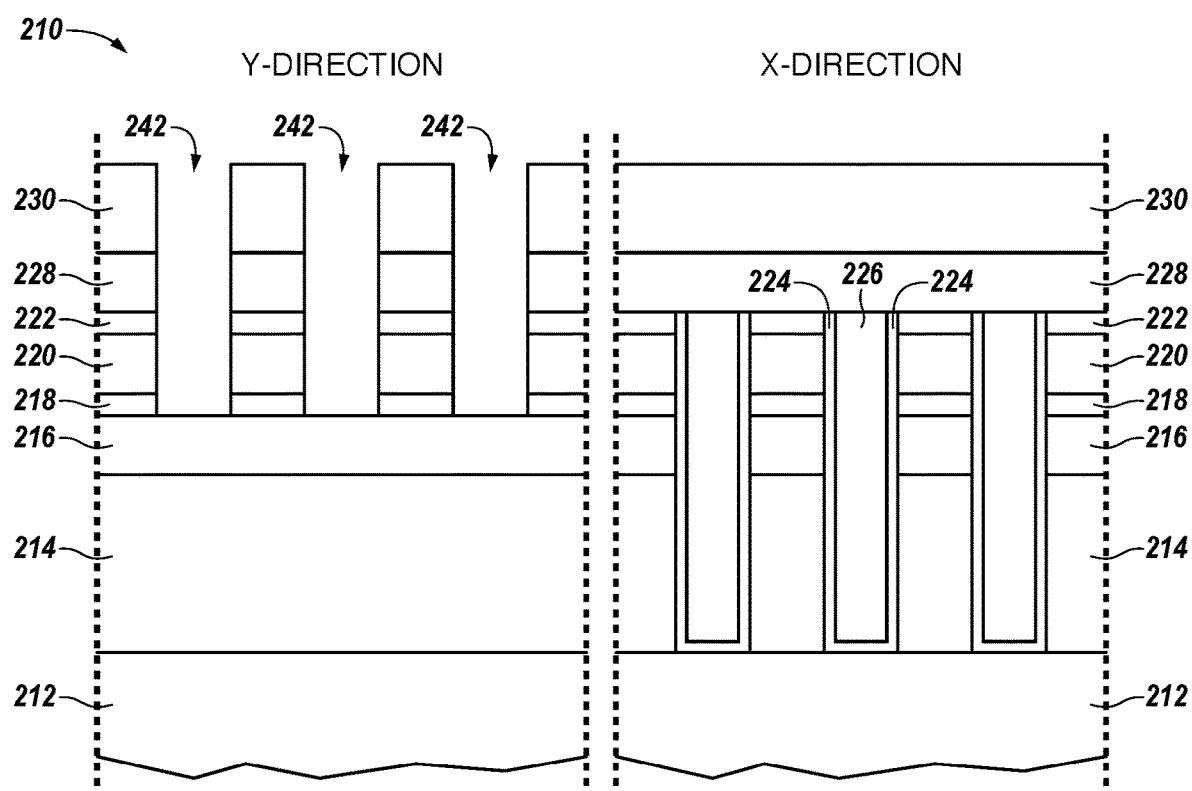

FIG. 2F illustrates the array structure 210 shown in FIG. 2E subsequent to performing an etch resulting in openings 242. In this example, the etch is performed along the x-direction through the second conductive material 230, second resistor material 228, second electrode 222, memory material 220, and first electrode 218.

In this example, the etch ends/stops on the first resistor material 216 such that the first resistor material 216 is continuous across multiple memory cells (e.g., in the y-direction). However, embodiments are not so limited. For example, the etch associated with FIG. 2F can also be performed through the first resistor material 216 such that the etch further defines the first resistor material 216. As a result, the first resistor material 216 is etched twice (e.g., during the etch illustrated in FIG. 2B and the etch illustrated in FIG. 2F) so as to result in a completely isolated first resistor that is not continuous over multiple memory cells (e.g., in either the x-direction or the y-direction).

As an example, the openings 242 can be formed via a single patterned mask etch process. For instance, a liner material (e.g., a dielectric) can be formed on the stack after the resistor material 228 is etched but prior to etching of the memory material 220, which may provide benefits such as protecting the memory material 220 from an etchant used to etch through the resistor material 228 and/or conductive material 230 (e.g., to prevent cross-contamination of materials).

Figure 2G:
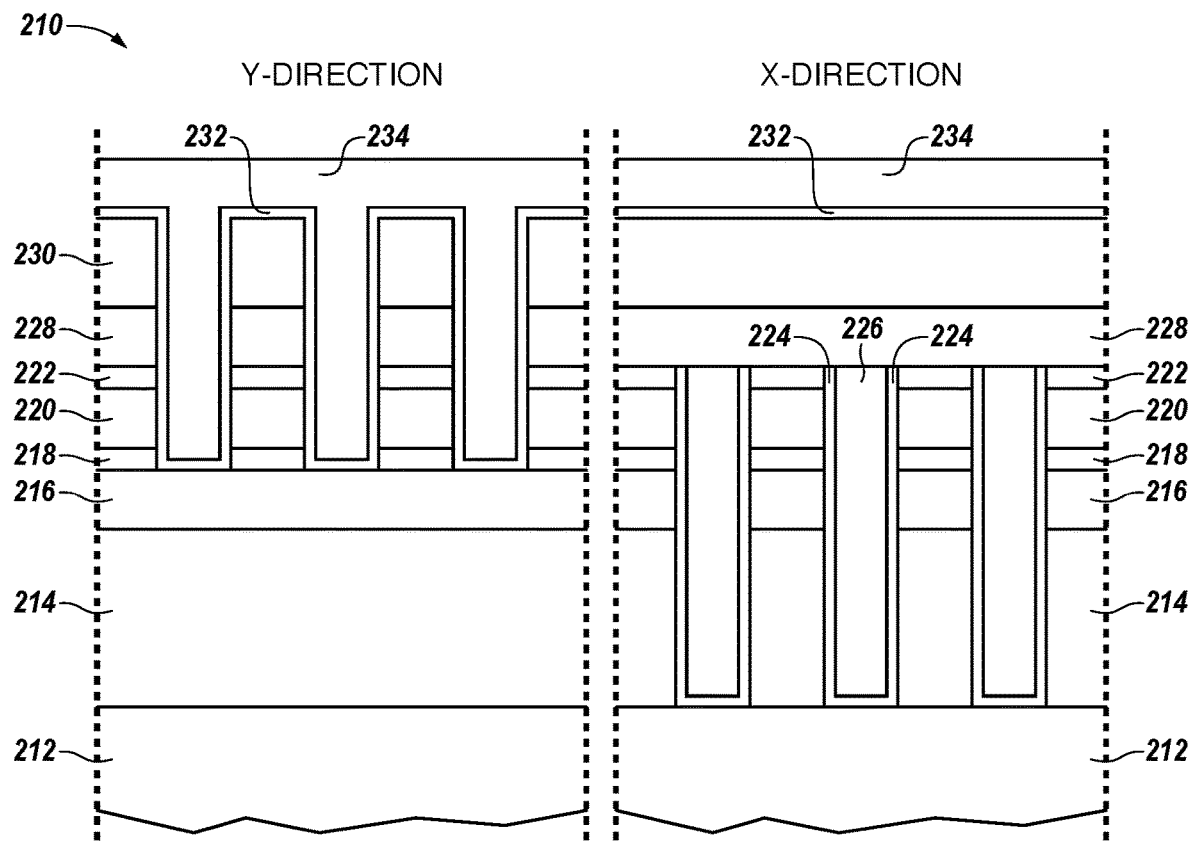

FIG. 2G illustrates the array structure 210 shown in FIG. 2F subsequent to formation of respective sealing and filing materials 232 and 234 in the openings 242. The second resistor material 228 can be, for example, titanium-silicon nitride (TiSiN). However, embodiments are not so limited. For instance, the first and second resistor materials 216 and 228 can be a metallic (or semi-metallic) material such as tungsten nitride (WN), tungsten-silicon nitride (WSiN), and/or tungsten carbide (WC), among other suitable materials. For example, materials forming the first and second materials 216 and 228 may have a range of resistivity from about $1\times10^{-6}$*Ohm*cm to $100\times10^{-6}$*Ohm*cm, although embodiments are not so limited. For example, the resistor materials 216 and/or 228 may have a relatively high resistance of at least $1\times10^{-3}$*Ohm*cm. In a number of embodiments, at least one of the resistor materials 216 and 228 has a resistivity of at least $300\times10^{-6}$ Ohm*cm. Further, the first and second resistor materials 216 and 228 may each comprise a different resistor material.

The resistors comprising first and/or second resistor materials 216 and 228 and formed between respective corresponding conductive lines 214 and 230 can prevent and/or reduce the magnitude of a current spike associated with a capacitive discharge through corresponding memory cells in association with a state transition of the switch element (e.g., from off to on). The resistance of respective resistors comprised of materials 216 and 228 can be "tuned" to achieve a desired suitable magnitude of the associated current spike associated with operation of the memory cells. For instance, the particular characteristics of resistor materials 216 and 218 (e.g., composition, thickness, etc.) can be selected based on a variety factors such as the composition of the memory material 220, among various other factors to achieve a desired result.

FIGS. 3A-3I illustrate cross-sectional views of an example of processing steps associated with forming a portion of an array of memory cells in accordance with a number of embodiments of the present disclosure. As indicated, the left side of FIGS. 3A-3I represents a cross-sectional view along a y-direction (e.g., a word line direction), and the right side of FIGS. 3A-3I represents a cross-sectional view along an x-direction (e.g., a bit line direction) in this example.

Figure 3A:
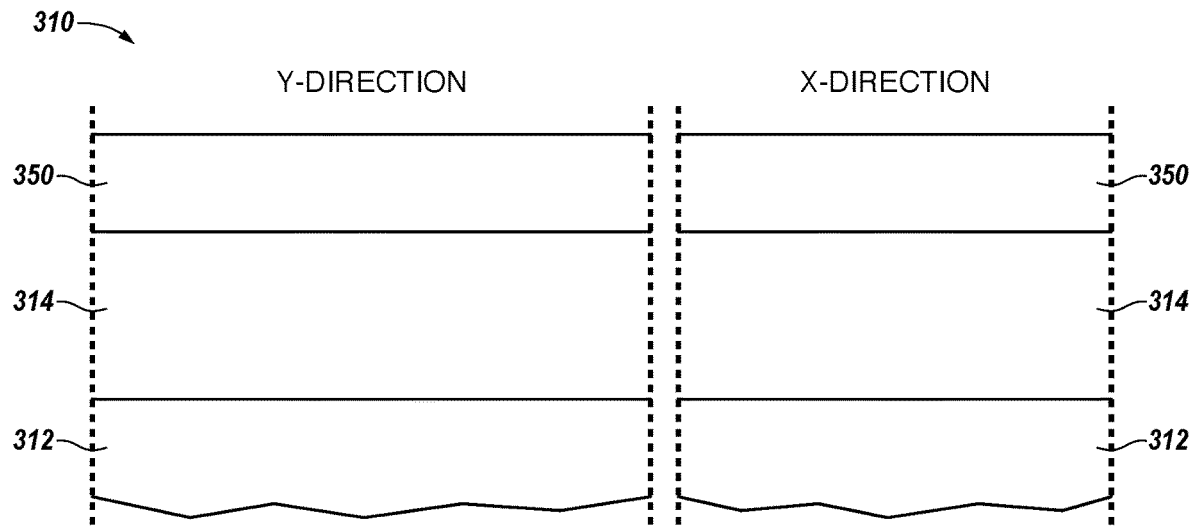
FIGS. 3A-3I illustrate cross-sectional views of an example of processing steps associated with forming a portion of an array of memory cells in accordance with a number of embodiments of the present disclosure.

FIG. 3A illustrates an array structure 310 comprising a dielectric material 350 formed on a first conductive material 314, and the first conductive material 314 formed on a substrate 312. Although embodiments are not so limited, the substrate 312 and the first conductive material 314 are analogous to the substrate 212 and the conductive material 214, respectively, as described in association with FIGS. 2A-2G.

Figure 3B:
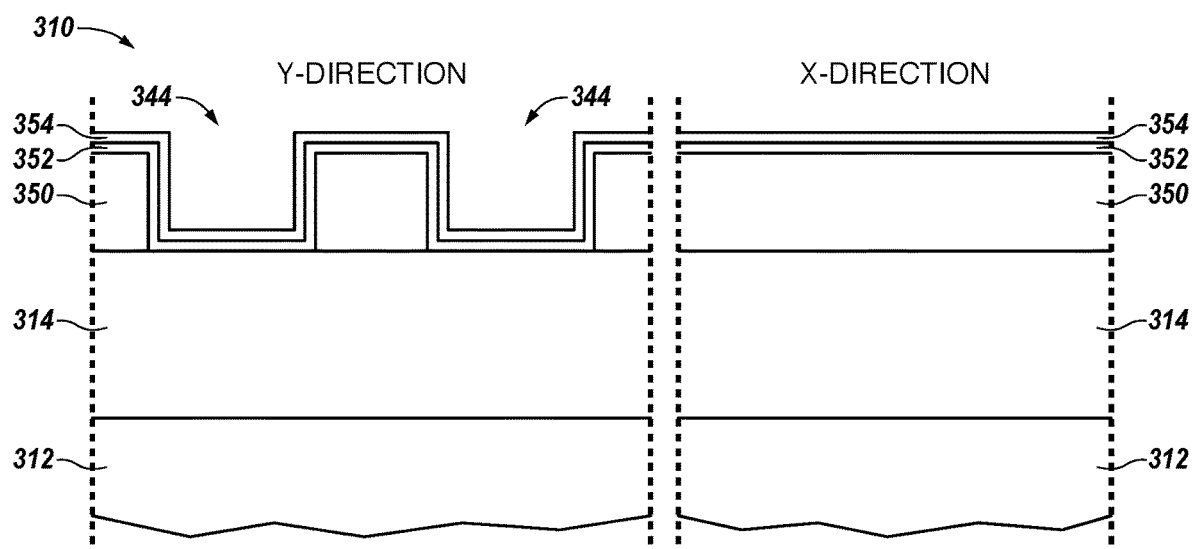

FIG. 3B illustrates the array structure 310 shown in FIG. 3A after a number of subsequent processing steps. As an example, the subsequent processing steps include performing an etch (e.g., along a x-direction) through the dielectric material 350 to form a number of trenches 344, forming a resistor material 352 in the openings 344, and forming an insulating material 354 on the resistor material 352. In a number of embodiments, the insulating material 354 can be a dielectric material. The resistor material 352 can comprise various materials such as those described above in association with resistor materials 216 and 228, for example.

Figure 3C:
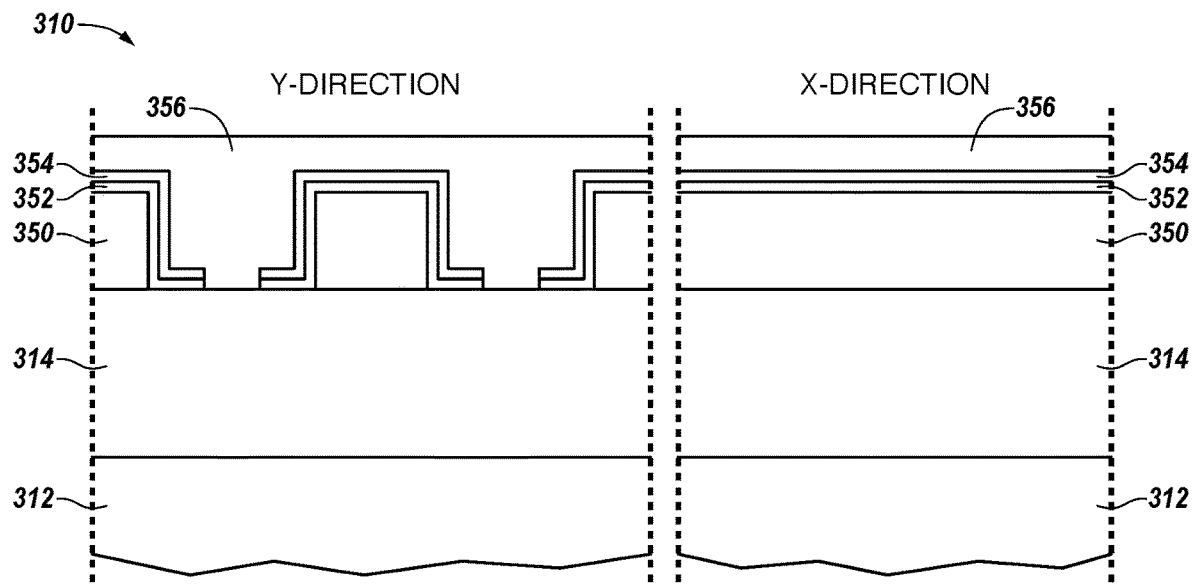

FIG. 3C illustrates the array structure 310 shown in FIG. 3B after a number of subsequent processing steps. As an example, the subsequent processing steps include performing a mask and etch through the resistor material 352 and the insulating material 354 formed on a bottom of the openings 344 such that each of the plurality of resistor material 352 and the insulating material 354 is separated from each other, as illustrated in FIG. 3C. As an example, the subsequent processing steps further include filling each of the plurality of openings 344 with the dielectric material 356. The dielectric materials 350 and 356 can be same dielectric material; although, embodiments are not so limited.

Figure 3D:
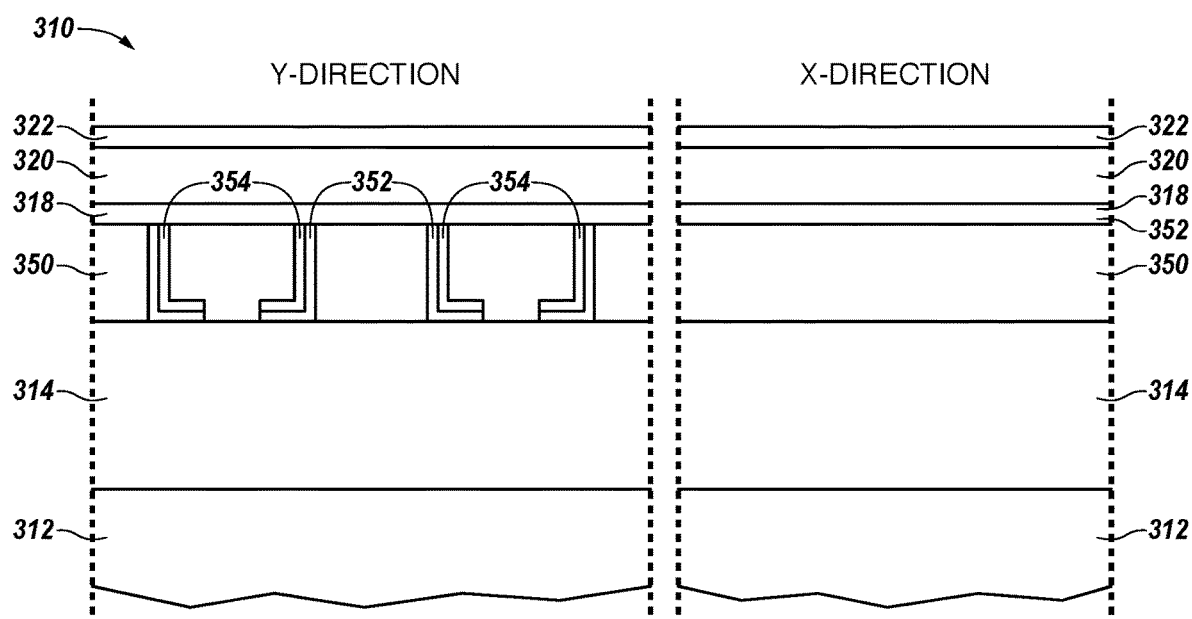

FIG. 3D illustrates the array structure 310 shown in FIG. 3C after a number of subsequent processing steps. As an example, the subsequent processing steps include performing a planarization process on the dielectric material 356, and resistor material 352, and the insulating material 354 to define a number of "L-shaped" vertical resistors (e.g., by exposing an upper surface of respective instances of resistor material 352), and forming a first electrode material 318, a memory material 320, and a second electrode material 322 on the planarized surface. The planarization process can be a CMP process, for instance.

Although the first electrode material 318 is formed on the planarized surface of the stack (e.g., the stack comprising the dielectric material 350, the dielectric material 356, the resistor material 352, and the insulating 354), embodiments are not so limited. For example, the memory material 320 can be formed on the planarized surface of the stack without forming the first electrode 318 between the memory material 320 and the stack. Forming the memory material 320 on the resistor material 352 and the insulating material 354 can further enhance current crowding (e.g., non-homogenous distribution of current density) on a surface of the memory material 320 such that polarity of the memory material 320 is further induced.

Figure 3E:
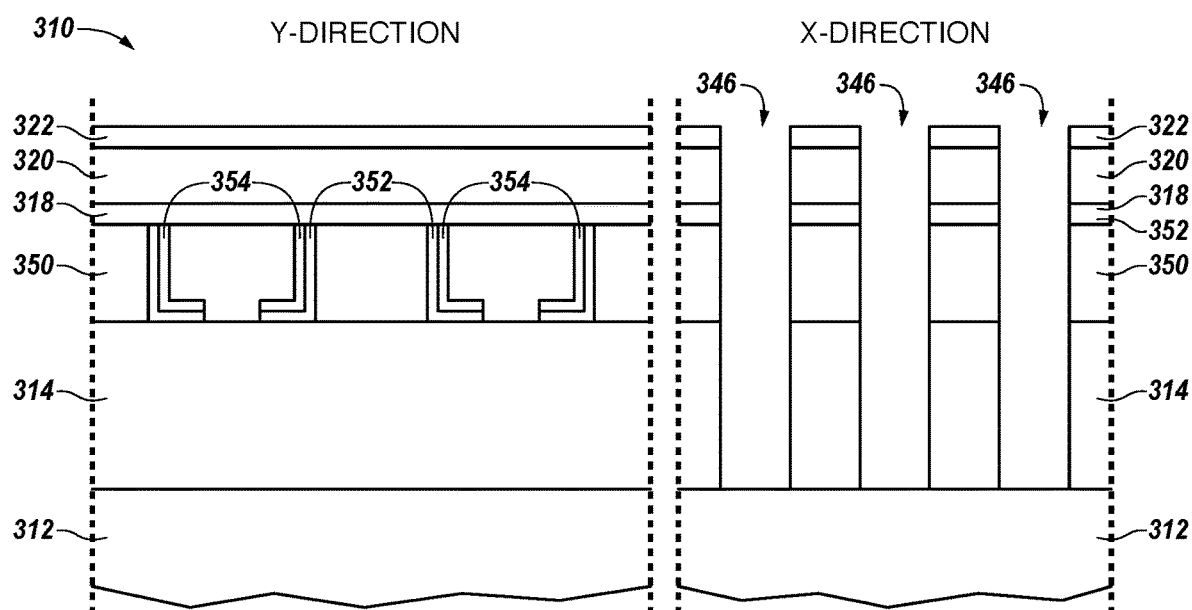

FIG. 3E illustrates the array structure 310 shown in FIG. 3D subsequent to performing an etch resulting in openings 346. In this example, the etch is performed along the y-direction through the second electrode material 322, memory material 320, first electrode material 318, dielectric material 350 (including resistor material 352, and insulating material 354), and the first conductive material 314. Performing the etch shown in FIG. 3E results in definition of conductive lines 314 extending in the y-direction (e.g., word line direction).

As an example, the openings 346 can be formed via a single patterned mask etch process. However, embodiments are not so limited. For instance, a liner material (e.g., a dielectric) can be formed on the stack after the memory material is etched but prior to etching of the dielectric material 350 and/or conductive material 314, which may provide benefits such as protecting the memory material 320 from an etchant used to etch through the dielectric material 350 and/or conductive material 314 (e.g., to prevent cross-contamination of materials).

Figure 3F:
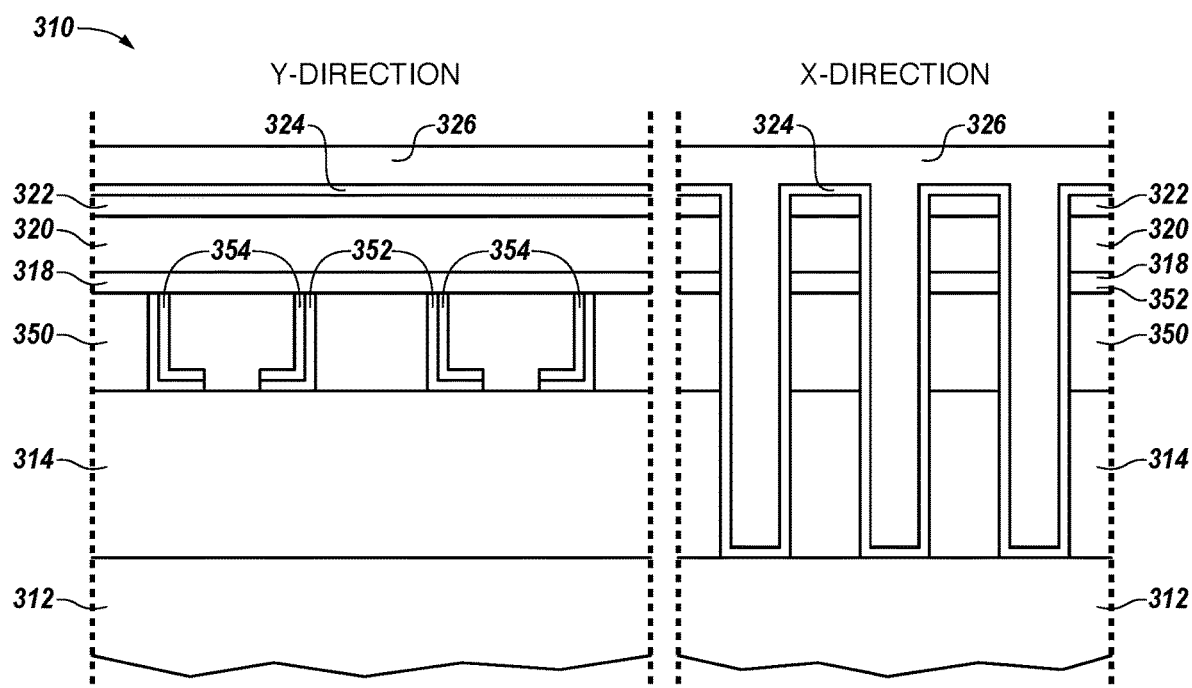

FIG. 3F illustrates the array structure 310 shown in FIG. 3E subsequent to formation of sealing and filling materials 324 and 326, respectively, in the openings 346. As an example, the sealing material 324 can be formed on a stack shown in FIG. 3E (e.g., the stack comprising the second electrode material 322, memory material 320, first electrode material 318, dielectric material 350 (including the resistor material 352 and insulating material 354), and first conductive material 314). The sealing material 324 can be formed via a process such as an ALD process or a conformal CVD process, for instance. The filling material 326 can be formed on the stack and can serve to isolate memory cells, for instance. The sealing and filling materials 324 and 326 comprise various materials such as those described above in association with the sealing and filling materials 224 and 226.

Figure 3G:
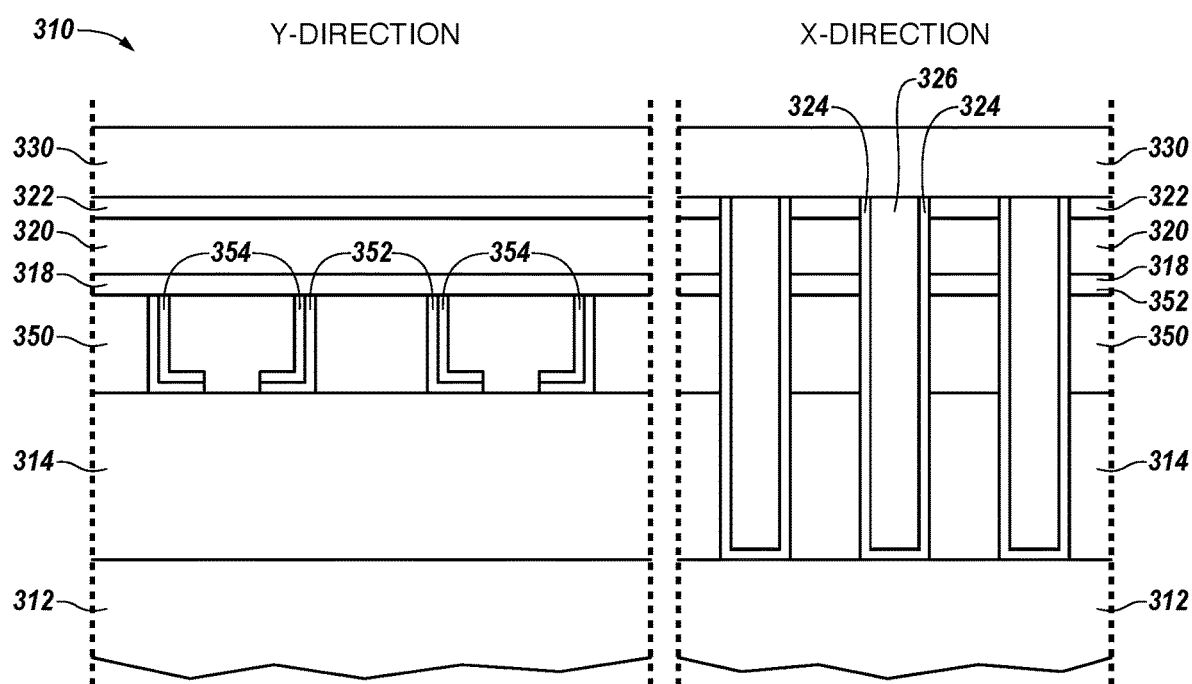

FIG. 3G illustrates the array structure 310 shown in FIG. 3F after a number of subsequent processing steps. The subsequent processing steps include performing a planarization process (e.g., CMP) to expose an upper surface of the electrode material 322 (e.g., by removing portions of sealing material 324 and filling material 326), and forming a second conductive material 330 on the planarized surface thereon.

Figure 3H:
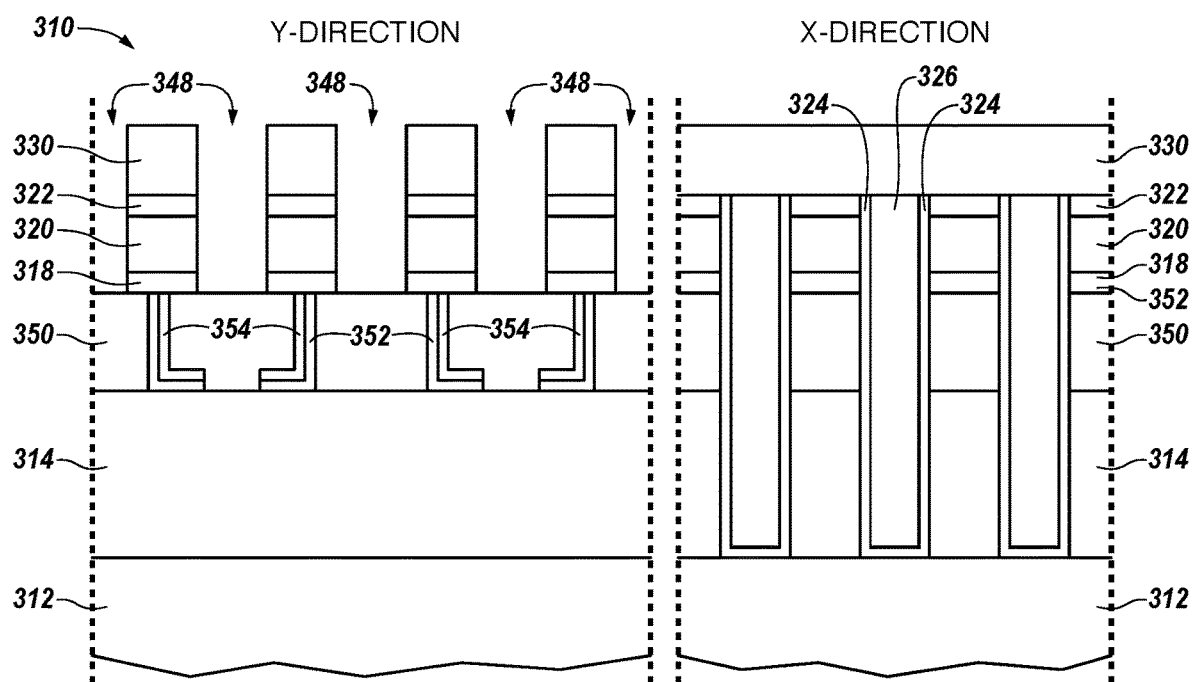

FIG. 3H illustrates the array structure 310 shown in FIG. 3G subsequent to performing an etch resulting in openings 348. In this example, the etch is performed along the x-direction through the second conductive material 330, the second electrode material 322, the memory material 320, and the first electrode material 318. Performing the etch results in definition of the second conductive lines 330 extending in the x-direction (e.g., bit line direction).

As an example, openings 348 can be formed via a single patterned mask etch process. However, embodiments are not so limited. For instance, a liner material (e.g., a dielectric) can be formed on the stack after the memory material is etched but prior to etching of the memory material 320, which may provide benefits such as protecting the memory material 320 from an etchant used to etch through the conductive material 330 (e.g., to prevent cross-contamination of materials).

Figure 3I:
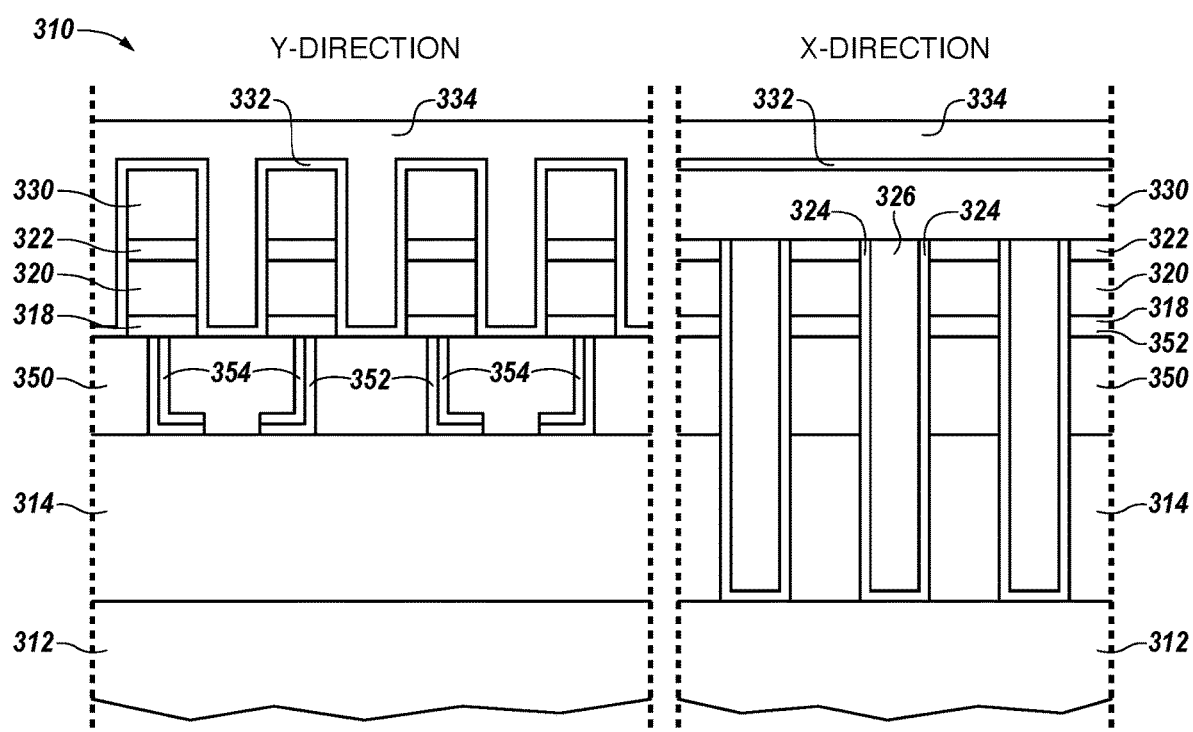

FIG. 3I illustrates the array structure 310 shown in FIG. 3H subsequent to formation of sealing and filling materials 332 and 334, respectively, in the openings 348. As an example, the sealing material 332 can be formed on a stack shown in FIG. 3H (e.g., the stack comprising the second conductive material 330, second electrode material 322, memory material 320, and first electrode material 318). The sealing material 332 can be formed via an ALD process or a conformal CVD process, for instance. The filling material 334 can be formed on the stack and can serve to isolate memory cells, for instance. The sealing and filling materials 332 and 334 comprise various materials such as those described above in association with the sealing and filling materials 224 and 226.

The resistor 352 can be a vertical resistor 352 (e.g., a resistor that is vertically placed within the dielectric material 352) and can be in contact with each respective one of the plurality of memory cells. The vertical resistor 352 may provide a resistance to allow high resistivity relative to that of the resistor 216 and/or the resistor 228. For instance, the length of resistor 352 in the direction of current flow can be greater than the lengths of resistor 216 and 228. Therefore, the vertical resistor 352 may provide a greater resistance than the first resistor 216 and/or the second resistor 228.

Figure 4:
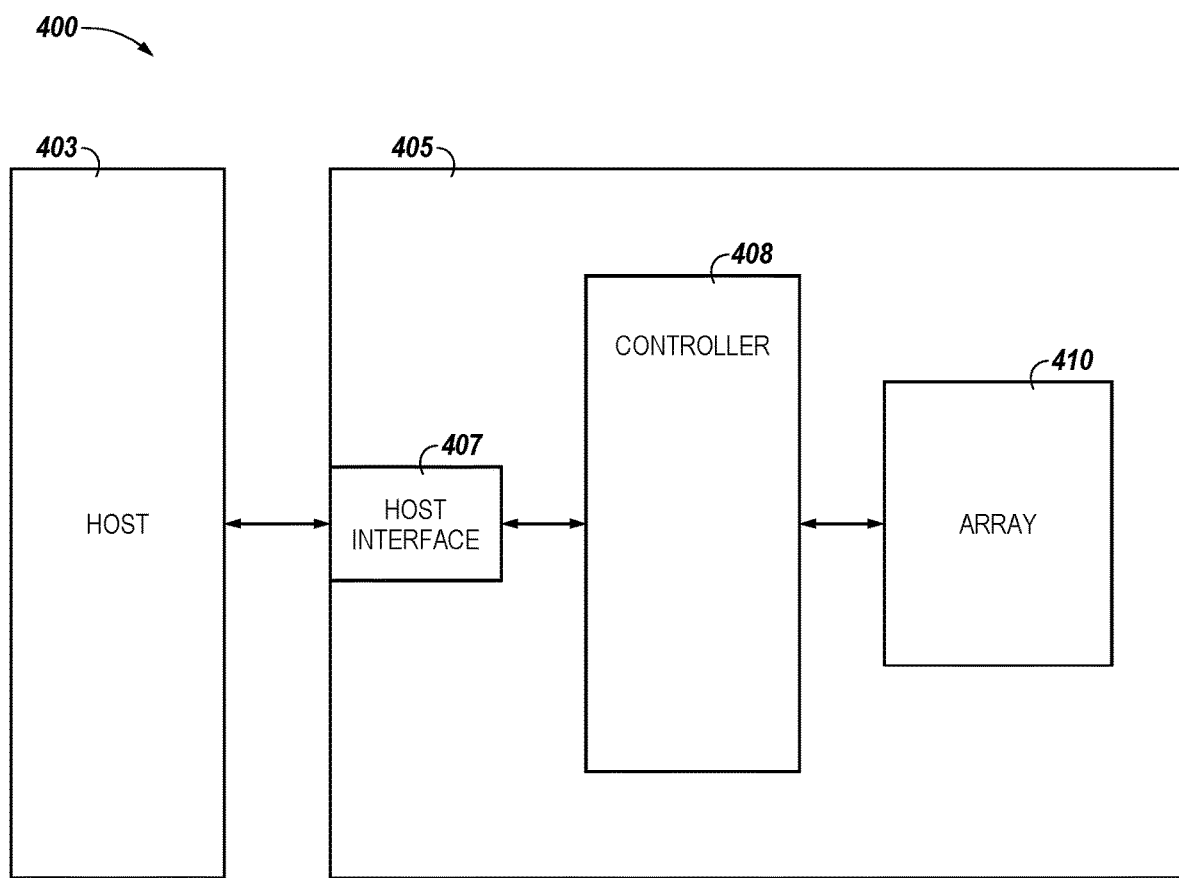
FIG. 4 is a block diagram of an apparatus in the form of a computing system including an array of memory cells having resistors in accordance with a number of embodiments of the present disclosure.

FIG. 4 is a block diagram of an apparatus in the form of a computing system 400 including an array 410 of memory cells having resistors in accordance with a number of embodiments of the present disclosure. As used herein, a memory system 405, a controller 408, or an array 410 might also be separately considered an "apparatus." The memory system 405 can be a solid state drive (SSD), for instance, and can include a host interface 407, a controller 408 (e.g., a sequencer and/or other control circuitry), and a number of memory arrays 410, which can be referred to as memory 410.

The controller 408 can be coupled to the host interface 407 and to the memory array 410 via a plurality of channels and can be used to transfer data between the memory system 405 and a host 403. The interface 407 can be in the form of a standardized interface. For example, when the memory system 405 is used for data storage in a computing system 400, the interface 407 can be a serial advanced technology attachment (SATA), peripheral component interconnect express (PCIe), or a universal serial bus (USB), among other connectors and interfaces. In general, however, interface 407 can provide an interface for passing control, address, data, and other signals between the memory system 405 and a host 403 having compatible receptors for the interface 407.

Host 403 can be a host system such as a personal laptop computer, a desktop computer, a digital camera, a mobile telephone, or a memory card reader, among various other types of hosts. Host 403 can include a system motherboard and/or backplane and can include a number of processing resources (e.g., a number of processors).

The controller 408 can communicate with the memory array 410 (which in some embodiments can be a number of memory arrays on a single die) to control data read, write, and erase operations, among other operations. As an example, the controller 408 can be on a same die or a different die than a die or dice corresponding to memory array 410.

Although not specifically illustrated, the controller 408 can include a discrete memory channel controller for each channel coupling the controller 408 to the memory array 410. The controller 408 can include, for example, a number of components in the form of hardware and/or firmware and/or software for controlling access to the memory array 410 and/or for facilitating data transfer between the host 403 and memory array 410.

The memory array 410 can include a number of arrays of memory cells (e.g., non-volatile memory cells). The array 410 can be, for example, a cross-point array comprising cells formed in accordance with embodiments described herein. The array 410 can be a 3D memory array. As an example, the memory cells can be 3D cross point memory cells.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An array of memory cells, comprising:
   a plurality of first conductive lines formed in a first direction;
   a plurality of second conductive lines formed in a second direction; and
   a plurality of memory cells located between the plurality of first conductive lines and the plurality of second conductive lines, each one of the plurality of memory cells comprising:
   a memory element comprising one or more memory materials; and
   a resistor, wherein the resistor is formed of a resistor material continuous across multiple memory cells of the plurality of memory cells such that the resistor is in contact with memory elements of multiple memory cells;
   wherein the resistor comprises a first resistor, and wherein each one of the plurality of memory cells further comprises a second resistor, and wherein:
   the first resistor is formed between the memory element and a respective one of the first conductive lines; and
   the second resistor is formed between the memory element and a respective one of the second conductive lines.

2. The array of claim 1, wherein the resistor is formed in direct contact with a respective one of the plurality of first conductive lines such that the resistor is continuous across multiple memory cells coupled to the respective first conductive line.

3. The array of claim 2, wherein each one of the plurality of cells memory cells further comprises an electrode between the resistor and the respective one of the plurality of first conductive lines.

4. The array of claim 1, wherein at least one of the first resistor and the second resistor has a resistivity of at least $300 \times 10^{-6}$ Ohm*cm.

5. The array of claim 1, wherein the second resistor is isolated such that it is not continuous across multiple memory cells of the plurality of memory cells.

6. The array of claim 1, wherein the resistor is configured to reduce a capacitive discharge through the memory element during a state transition the memory element.

7. The array of claim 1, wherein the resistor is a vertical resistor.

8. The array of claim 1, wherein the one or more memory materials comprises a single memory material serving as both a storage element and a switch element.

9. The array of claim 1, wherein the one or more memory materials comprises a first memory material serving as a storage element of the memory element and a second memory material serving as a switch element of the memory element.

10. A method of forming a memory cell, comprising:
forming a plurality of first conductive lines in a first direction;
forming a plurality of second conductive lines in a second direction;
forming a plurality of memory cells between the plurality of first conductive lines and the plurality of second conductive lines, each one of the plurality of memory cells comprising:
a memory element comprising one or more memory materials; and
a resistor, wherein the resistor is formed of a resistor material continuous across multiple memory cells of the plurality of memory cells such that the resistor is in contact with memory elements of multiple memory cells;
wherein:
forming the plurality of first conductive lines in the first direction comprises forming a first conductive material; and
forming the plurality of memory cells between the plurality of first conductive lines and the plurality of second conductive lines comprises forming a resistor material on the first conductive material;
wherein the method includes:
performing a first etch through a stack comprising the first conductive material and the resistor material such that a respective plurality of resistor material lines are defined along with the plurality of first conductive lines through the first etch.

11. The method of claim 10, wherein forming the plurality of second conductive lines in the second direction comprises forming a second conductive material, and wherein the method further includes:
forming, subsequent to performing the first etch, the second conductive material on the one or more memory element materials; and
performing a second etch through the second conductive material to define the plurality of second conductive lines, wherein the second etch stops on the plurality of resistor material lines such that the plurality of resistor materials are continuous in the first direction.

12. The method of claim 10, wherein forming the plurality of second conductive lines in the second direction comprises forming a second conductive material, and wherein the method further includes:
forming, subsequent to performing the first etch, the second conductive material on the one or more memory element materials; and
performing a second etch through the second conductive material to define the plurality of second conductive lines, wherein the second etch stops on the plurality of resistor material lines such that the plurality of resistor material lines are continuous in the first direction.

13. An array of memory cells, comprising:
a plurality of first conductive lines formed in a first direction;
a plurality of second conductive lines formed in a second direction; and
a plurality of memory cells located between the plurality of first conductive lines and the plurality of second conductive lines, each one of the plurality of memory cells comprising:
a memory element comprising one or more memory materials; and
a resistor, wherein:
the resistor is formed in at least one of the first and the second directions and in contact with memory elements of multiple memory cells; and
the resistor is configured to reduce a capacitive discharge through the memory element during a state transition of the memory element;
wherein:
the resistor is a vertical resistor that is in contact with a respective one of the first conductive lines via a first surface and with the memory element via a second surface; and
a surface area of the first surface is greater than a surface area of the second surface.

14. The array claim 13, wherein the memory element further comprises:
a first electrode material formed between a first surface of the memory element and a respective one of the plurality of resistors; and
a second electrode material formed between a second surface of the memory element and a respective one of the plurality of second conductive lines.

15. The array claim 13, wherein the resistor is one of a plurality of resistors formed in the first direction, and wherein the resistor in direct contact with the a respective one of the plurality of first conductive lines such that the first resistor is continuous along the first direction.

16. An array of memory cells, comprising:
a plurality of first conductive lines formed in a first direction;
a plurality of second conductive lines formed in a second direction; and
a plurality of memory cells located between the plurality of first conductive lines and the plurality of second conductive lines, each one of the plurality of memory cells comprising:
a memory element comprising one or more memory materials; and
a resistor, wherein the resistor is formed of a resistor material continuous across multiple memory cells of the plurality of memory cells such that the resistor is in contact with memory elements of multiple memory cells;
wherein the one or more memory materials comprises a single memory material serving as both a storage element and a switch element.

17. An array of memory cells, comprising:
a plurality of first conductive lines formed in a first direction;
a plurality of second conductive lines formed in a second direction; and
a plurality of memory cells located between the plurality of first conductive lines and the plurality of second conductive lines, each one of the plurality of memory cells comprising:
a memory element comprising one or more memory materials; and
a resistor, wherein the resistor is formed of a resistor material continuous across multiple memory cells of the plurality of memory cells such that the resistor is in contact with memory elements of multiple memory cells;

wherein the one or more memory materials comprises a first memory material serving as a storage element of the memory element and a second memory material serving as a switch element of the memory element.

18. A method of forming a memory cell, comprising:

forming a plurality of first conductive lines in a first direction;

forming a plurality of second conductive lines in a second direction;

forming a plurality of memory cells between the plurality of first conductive lines and the plurality of second conductive lines, each one of the plurality of memory cells comprising:
- a memory element comprising one or more memory materials; and
- a resistor, wherein the resistor is formed of a resistor material continuous across multiple memory cells of the plurality of memory cells such that the resistor is in contact with memory elements of multiple memory cells;

wherein forming the plurality of memory cells between the plurality of first conductive lines in the first direction comprises forming a plurality of vertical resistors between the plurality of first conductive lines and the one or more memory element materials, wherein the method includes:

forming a first dielectric material on the first conductive line material;

forming a plurality of trenches in the first dielectric material extending in the second direction;

forming the resistor material in the plurality of trenches such that a portion of the resistor material is formed in the plurality of trenches; and performing an etch through the portion of the resistor material formed in the plurality of trenches to form a respective plurality of resistor material lines extending in the second direction.

19. The method of claim 18 wherein the method includes filling, subsequent to performing the etch through the portion of the resistor material, each of the plurality of trenches with a second dielectric material such that the one or more memory element materials are in contact with the first dielectric material, the plurality of resistor material lines, and the second dielectric material.

\* \* \* \* \*